United States Patent
Keri

[11] Patent Number: 5,861,656
[45] Date of Patent: Jan. 19, 1999

[54] HIGH VOLTAGE INTEGRATED CIRCUIT

[75] Inventor: Imre Keri, Sollentuna, Sweden

[73] Assignee: Telefonaktiebolaget LM Ericsson, Stockholm, Sweden

[21] Appl. No.: 855,490

[22] Filed: Mar. 23, 1992

Related U.S. Application Data

[63] Continuation of Ser. No. 619,006, Nov. 28, 1990, abandoned.

[30] Foreign Application Priority Data

Dec. 6, 1989 [SE] Sweden .................................. 8904120

[51] Int. Cl.⁶ ..................................................... H01L 29/40
[52] U.S. Cl. ............................................ 257/491; 257/547
[58] Field of Search ..................... 357/52, 53, 40, 357/71, 23.11; 257/491, 547

[56] References Cited

U.S. PATENT DOCUMENTS

| | | | |
|---|---|---|---|
| 3,611,071 | 10/1971 | Augusta | 257/630 |
| 3,665,265 | 5/1972 | Fujimoto | 357/52 |
| 3,745,428 | 7/1973 | Misawa et al. | |
| 3,836,998 | 9/1974 | Kocsis et al. | |
| 4,011,581 | 3/1977 | Kubo et al. | |
| 4,423,433 | 12/1983 | Imaizumi et al. | 357/51 |
| 4,606,998 | 8/1986 | Clodgo et al. | 430/312 |
| 4,825,278 | 4/1989 | Hillenius et al. | 257/630 |
| 4,841,354 | 6/1989 | Inaba | 357/71 |
| 4,855,257 | 8/1989 | Kouda | 437/194 |

FOREIGN PATENT DOCUMENTS

| | | | |
|---|---|---|---|
| 0325234 | 1/1989 | European Pat. Off. | 357/65 |
| 2603747 | 8/1977 | Germany | 257/630 |
| 46-31929 | 9/1971 | Japan | 357/53 |
| 60-66444 | 4/1985 | Japan | 357/50 |
| 02-37776 | 2/1990 | Japan | 357/40 |
| 1351985 | 5/1974 | United Kingdom | 257/204 |

*Primary Examiner*—Donald Monin
*Attorney, Agent, or Firm*—Burns, Doane, Swecker & Mathis, L.L.P.

[57] ABSTRACT

The invention relates to a high voltage integrated circuit with connecting metal conductors (30, 32) connected to ground or potential near ground and covered by a passivating layer (18). The invention is characterized by said passivating layer (18) being partially broken up above said metal conductors to prevent activation of parasitic MOS-transistor.

8 Claims, 2 Drawing Sheets

HIGH VOLTAGE INTEGRATED CIRCUIT

This application is a continuation of application Ser. No. 07/619,006, filed Nov. 28, 1990, now abandoned.

The present invention relates to a high voltage integrated circuit suitable for preventing the formation of parasitic MOS-transistors.

BACKGROUND OF THE INVENTION

Integrated circuits usually comprise a passivating layer, for instance of phosphorus-doped silicone oxide. The surface resistivity of the passivating layer depends on the amount and quality of ions and water that are adsorbed on the surface. This highly resistive but still conducting layer can in certain cases behave like a GATE electrode ("water gate" if it comprises adsorbed water) for parasitic MOS-transistors that are formed between non-protected regions, for instance P-regions. The charging of the GATE electrode is performed from the bond surfaces and the scribe line if these elements are lying on the lowest potential or negative potential.

DESCRIPTION OF THE PRIOR ART

Normally integrated circuits are protected by a contiguous passivating layer, also called passivation, of for instance silicon oxide, silicon nitride or polyimide. Apertures are made for the bond pads and the scribe line. This technique is an industrial standard for plastic and hermetically capsulated integrated circuits. In conventional methods the inversion of the silicon between parasitic SOURCE and DRAIN electrodes is prevented in one of the following ways:

1) protection- or guard rings of n- or p-type;
2) a metal screen connected to the same potential as the silicon that is protected by the metal screen or a potential close to said potential;
3) a screen of polysilicon is connected to the same potential as the silicon that is protected by the polysilicon screen or a potential close to that potential.

However, all these methods have the drawback that they are rather complicated and require extra circuit area and/or processing steps in connection with manufacture.

OBJECT OF THE INVENTION

An object of the present invention is to provide in a simple manner a protection against parasitic MOS-transistors in high voltage integrated circuits.

SHORT DESCRIPTION OF THE INVENTION

The above object is achieved in connection with a high voltage integrated circuit with connecting metal conductors connected to ground or potential near ground and covered by a passivating layer by partially breaking up the passivating layer above the metal conductors to prevent activation of parasitic MOS-transistors.

In accordance with a preferred embodiment the passivating layer is slotted above the metal conductors.

In accordance with a further embodiment the slots are contiguous.

In accordance with another preferred embodiment the slots have a witdh of a few μm.

In accordance with an especially preferred embodiment the broken up pattern above the metal conductors is formed in the same processing step and in the same mask as the bond pads and the scribe lines.

SHORT DESCRIPTION OF THE DRAWING

The invention will be described in detail below with reference to the accompanying drawing, in which FIG. 1 illustrates the background of the problem that the invention intends to solve;

DETAILED DESCRIPTION OF THE INVENTION

In the following description the same reference designations will be used for the same elements or elements with similar functions.

Figure 1:
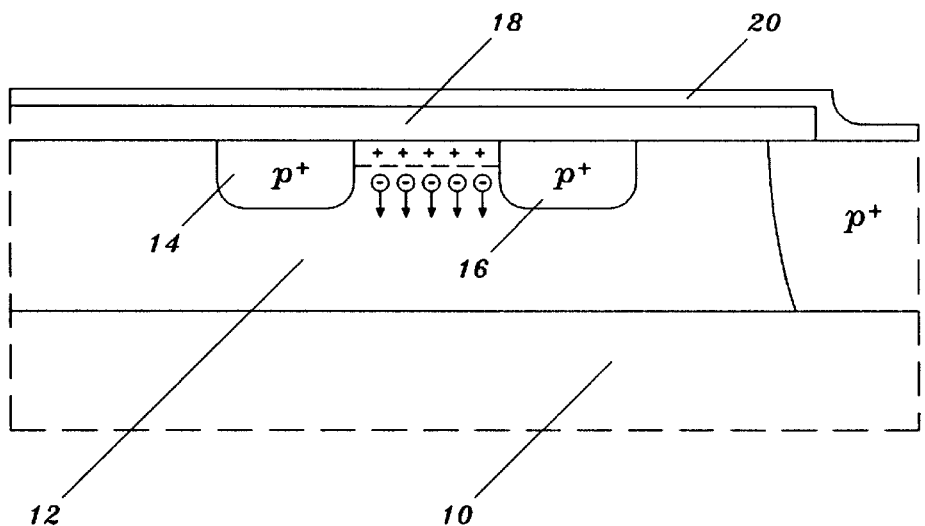

The background of the invention will be described in detail with reference to FIG. 1.

A substrate 10 intended to be connected to a negative potential, for instance of the order of −70 volt is covered by an epitaxial layer 12 of n-type. The epitaxial layer 12 comprises two p$^+$-doped regions 14, 16. On top of the epitaxial layer 12 there is a passivation 18. This can for instance comprise phosphorus-doped silicon, silicon nitride or polyimide. At the upper surface of the passivation, that is connected to negative potential, a surface layer 20 is formed by adsorption of ions and water. Due to the adsorption the surface resistivity of the passivating layer can deteriorate so that the surface layer 20 will form a GATE-electrode. Since the surface layer 20 is connected to negative potential the electrons between the p$^+$-doped regions 14, 16 in the epitaxial layer 12 will repel, so that a p-channel is formed between regions 14, 16. Hereby a so called parasitic MOS-transistor is formed.

Figure 2:
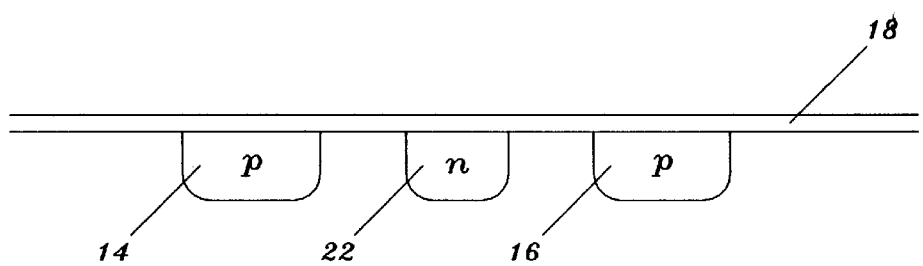
FIGS. 2–4 illustrate previously known methods for preventing the formation of parasitic MOS-transistors.
Figure 3:
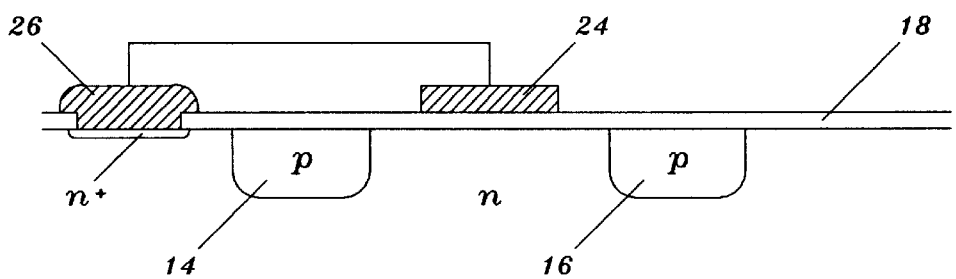
Figure 4:
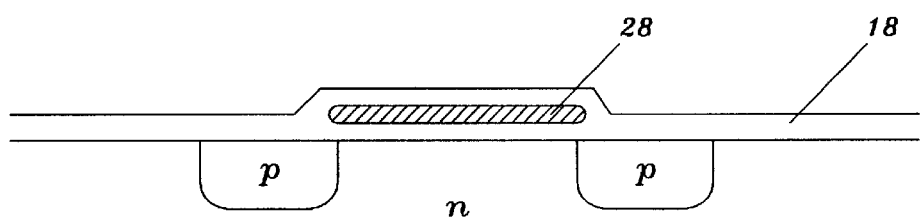

FIG. 2–4 illustrate three different known methods to prevent the formation of parasitic MOS-transistors. In the known design according to FIG. 2 a n$^+$-doped region 22 has been inserted between the two p-doped regions 14, 16. Hereby an excess of negative charge carriers is formed which compensates for the above mentioned effect. Similarly a p$^+$-doped region is provided between the n-doped regions 14, 16 if charge carriers of opposite polarity are used. The drawback with this method is that it is complicated since an extra protection region has to be doped in the epitaxial layer.

In the known design according to FIG. 3 a metal screen 24 is provided on top of the passivation 18. This metal screen 24 is connected to conventional metal conductors 26, which are connected to the same potential as the epitaxial layer. This method has the drawback that an extra metal conductor 24 has to be provided on the passivation 18 and that extra connections with the metal conductor 26 have to be established.

In the known design according to FIG. 4 a screen 28 of polysilicon, which is connected to the same potential as the epitaxial layer, is embedded in the passivation 18 in the critical region. The drawback of this method is that extra surface area is needed to embed the polysilicon screen in the passivation.

Figure 5:
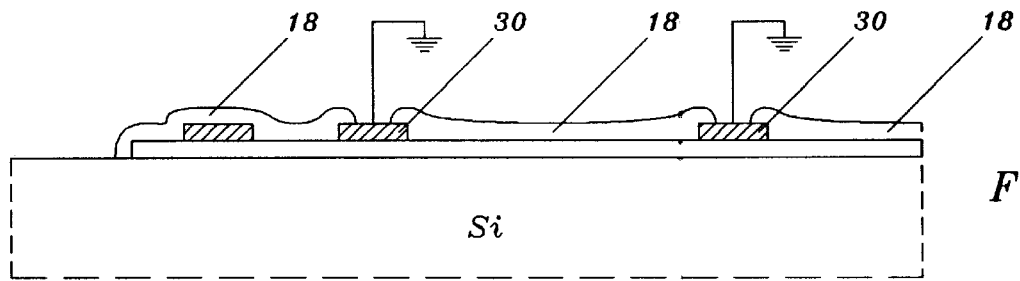
FIG. 5 shows a cross-sectional view of an integrated circuit in accordance with the present invention.

A preferred embodiment of the invention will now be described in detail with reference to FIGS. 5 and 6.

Normally the topology of the integrated circuit is formed in such a way that a grounded metal conductor 30 surrounds almost the whole chip and at several locations extends inwardly from its circumference. By opening the passivation 18 above metal conductors 30, 32 that are connected to ground or potential near ground as compared to applied voltage, the charging of the passivating surface can be prevented or delayed. In this way the scribe line, which normally lies on a potential with the largest distance to ground, and certain bond pads will be placed outside of the here partially non-passivated metal ring. The non-passivated metal that extends from the circumference of the chip forms a sort of channel/trap for charge carriers that are transported on the passivating surface. These charge carriers that are transported from the scribe line and bond pads connected to a potential far away from ground will be trapped by the non-passivated metal conductor.

Figure 6:
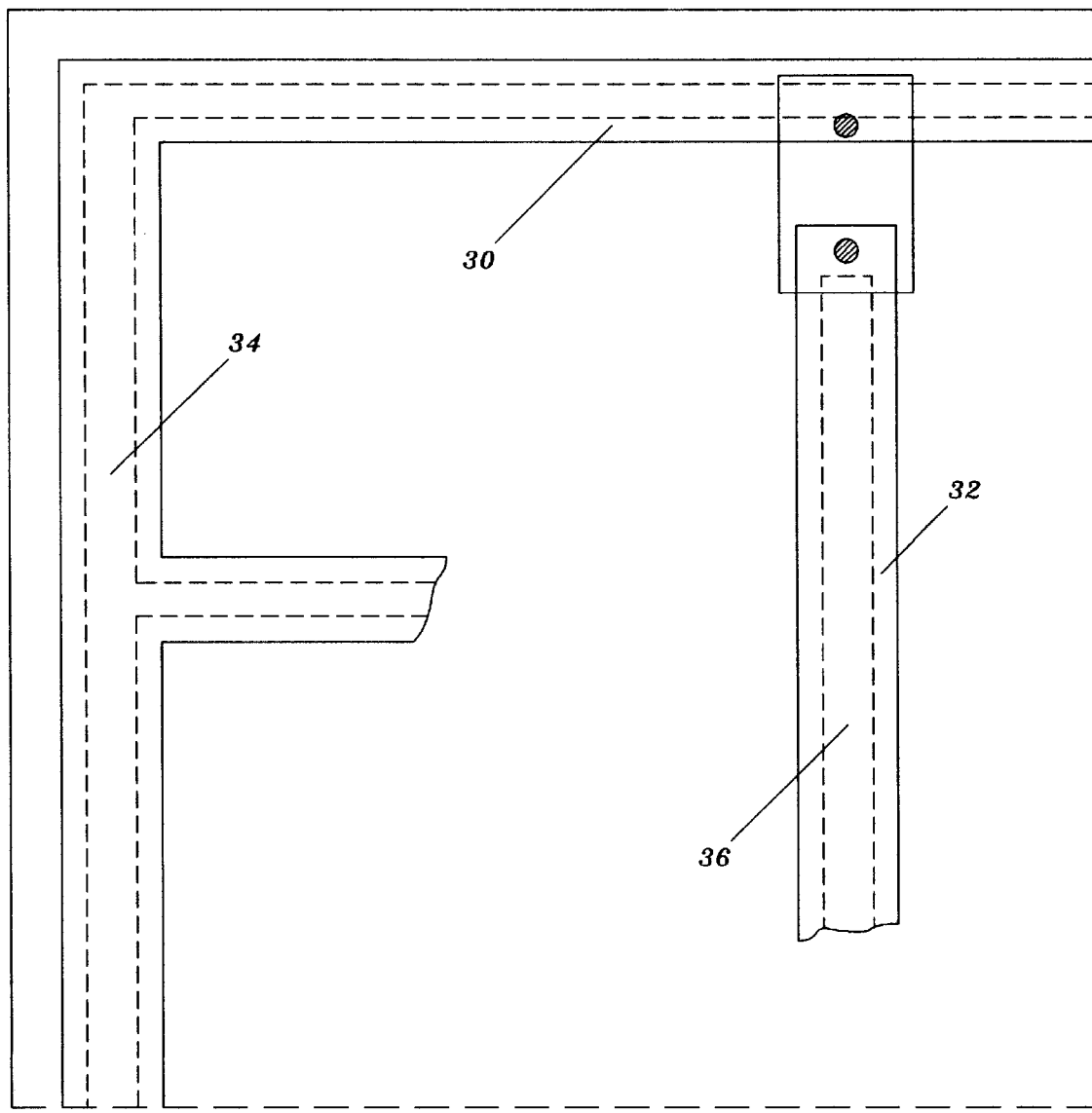
FIG. 6 shows a top view of an integrated circuit in accordance with the present invention.

FIG. 6 illustrates the opened parts of metal conductors 30, 32 in the form of slots 34, 36. However, it is appreciated that the apertures do not have to be contiguous but can have other shapes. For instance non-contiguous apertures can be provided on the conductors.

Apertures 34, 36 shown in FIG. 6 preferably have a width of a few $\mu$m. Preferably these openings are formed in the same masking step as the bond pads, which are necessary anyway. Thus, no extra surface area is required for forming these apertures. The only thing that is required is supplementing the mask for the bond pads.

I claim:

1. A high voltage integrated circuit comprising:

a substrate biased at a first potential; and interconnecting metal conductors biased at a second potential different from said first potential disposed on said substrate and partially covered by a passivating layer so as to prevent activation of parasitic MOS-transistors.

2. The circuit of claim 1, wherein said passivating layer is provided with slots which open said passivating layer above said metal conductors.

3. The circuit of claim 2, wherein said slots are contiguous.

4. The circuit of claim 2, wherein said slots have a width of a few $\mu$m.

5. A high voltage integrated circuit comprising:

a semiconductor substrate biased at a first potential;

a metallization pattern formed on said semiconductor substrate and including a plurality of narrow, elongated metal lines;

a terminal provided external to said high voltage integrated circuit held at a second potential different from said first potential and electrically connected to at least one of said elongated metal lines; and a passivation layer provided over said metallization layer and at least partially broken up along a length of said at least one of said elongated metal lines in such a manner that said at least one of said elongated metal lines traps charge carriers.

6. An integrated circuit comprising:

a substrate biased at a first potential; and means for preventing activation of parasitic transistors in said substrate including a plurality of elongated interconnecting conductors disposed on said substrate and held at a second potential.

7. The integrated circuit of claim 6, wherein said preventing means further includes:

a passivating layer disposed on said plurality of elongated interconnecting conductors and partially broken up thereover.

8. The integrated circuit of claim 7, wherein said passivating layer is broken up in a pattern which comprises elongated slots formed in the passivating layer above the elongated interconnecting conductors.

* * * * *